United States Patent [19]
Wadsworth et al.

[11] Patent Number: 5,701,492
[45] Date of Patent: Dec. 23, 1997

[54] FAIL-SAFE FLASHING OF EPROM

[75] Inventors: Robert D. Wadsworth, Costa Mesa; Daniel A. Danknick, Orange, both of Calif.

[73] Assignee: Canon Kabushiki Kaisha, Tokyo, Japan

[21] Appl. No.: 625,033

[22] Filed: Mar. 29, 1996

[51] Int. Cl.$^6$ ................. G06F 9/06; G06F 12/14
[52] U.S. Cl. ............ 395/712; 395/652; 395/430; 395/479; 395/483
[58] Field of Search ................. 395/651, 652, 395/653, 712, 430, 479, 483, 490, 750

[56] References Cited

U.S. PATENT DOCUMENTS

| | | | |
|---|---|---|---|
| 5,388,267 | 2/1995 | Chan et al. | 395/652 |
| 5,432,927 | 7/1995 | Grote et al. | 395/575 |
| 5,452,339 | 9/1995 | Siu et al. | 379/27 |
| 5,473,775 | 12/1995 | Sakai et al. | 395/700 |
| 5,522,076 | 5/1996 | Dewa et al. | 395/652 |
| 5,559,957 | 9/1996 | Balk | 395/652 |
| 5,568,641 | 10/1996 | Nelson et al. | 395/652 |
| 5,579,522 | 11/1996 | Christeson et al. | 395/652 |
| 5,592,641 | 1/1997 | Fandrich et al. | 395/430 |

*Primary Examiner*—Kevin A. Kriess
*Attorney, Agent, or Firm*—Fitzpatrick, Cella, Harper & Scinto

[57] ABSTRACT

A fail-safe flash for an EPROM that is arranged into separately erasable sectors proceeds in a stepwise procedure. The EPROM is divided into at least three regions including a boot block region, a file region and a directory region. The boot block region stores at least two independently erasable boot blocks, only one of which is designated as a current boot block, which performs scanning of the directory region so as to determine a current directory in the directory region. The file region stores all executables, including executables designated as critical and non-critical. The directory region stores multiple directories, only one of which is a current directory, which designates which is the current boot block, which of the files stored in the file region are available for loading for execution, as well as which of the files are critical and which are non-critical. In the first step to flash the EPROM, the unused region of the boot block is updated with the new boot block. In the second step of flashing the EPROM, critical files are flashed over non-critical files, and after correct installation of the newly-flashed critical files is confirmed, a new directory is written into the directory region referring only to the newly-flashed critical files. In the third step of flashing the EPROM, non-critical files are flashed, whereafter a new directory is written to the directory region referring to the newly-flashed critical files as well as to the newly-flashed non-critical files.

14 Claims, 7 Drawing Sheets

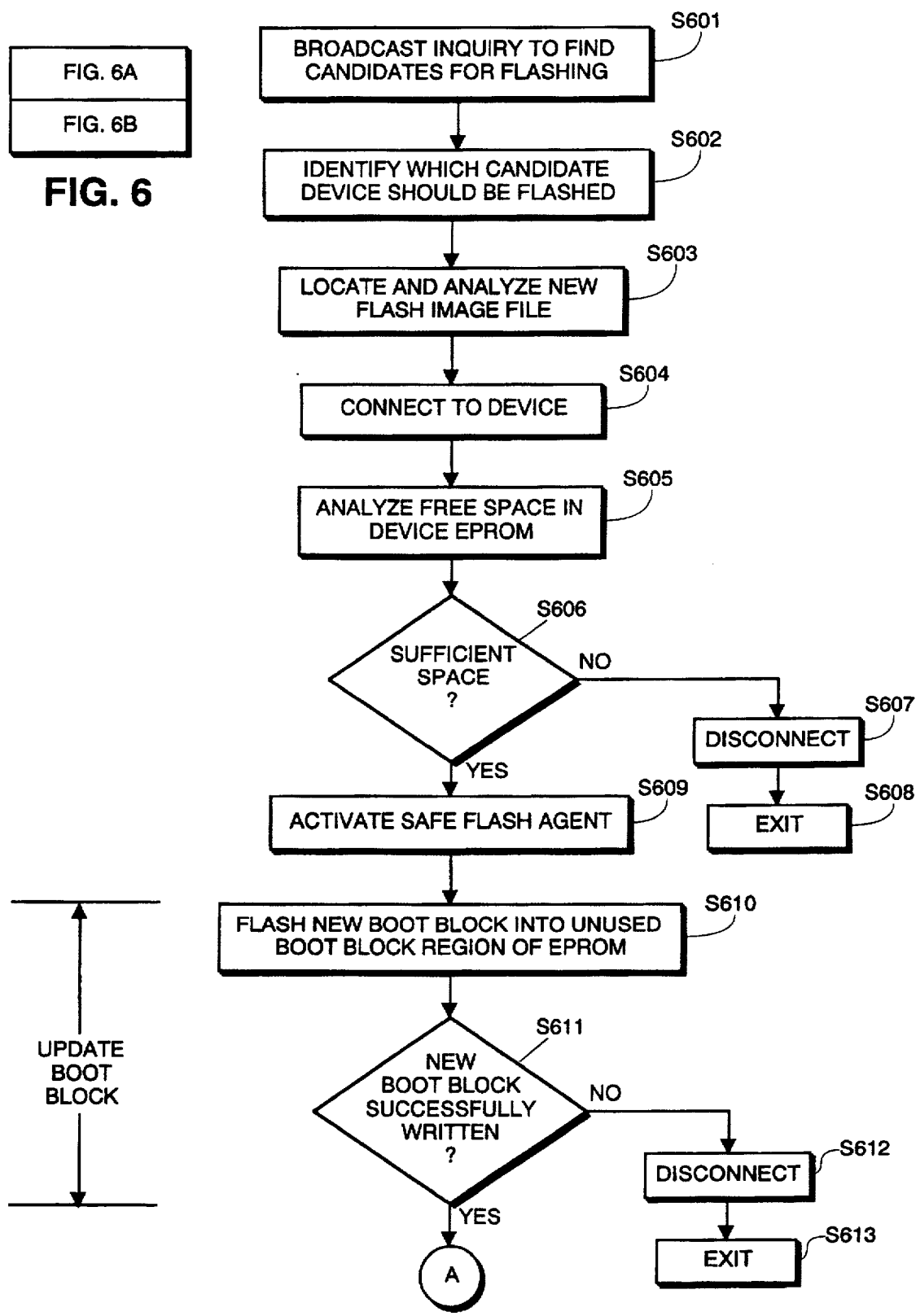

FAIL-SAFE FLASHING OF EPROM

BACKGROUND OF THE INVENTION

1. Field of the Invention

The present invention relates to flashing of EPROM (erasable programmable read only memory) by which new versions of software or firmware may be downloaded to EPROM in an embedded system. More particularly, the invention concerns fail-safe flashing of EPROM such that if errors are encountered during the flashing process, such as power fail errors or contaminated data errors, the embedded system will still be operational and can be flashed again.

2. Description of the Related Art

Almost all computer systems today include some sort of non-volatile read-only memory which contains the program steps that are executed at the moment power is applied. Typically, these program steps perform some level of self test and initialization, and then initiate the loading and execution of other software, for example, operating system software. Ordinarily, the self-test and initialization programs are referred to as "firmware" or "ROM BIOS" and were formerly stored in either ROM or EPROM.

When flash EPROM such as electrically erasable programmable read only memory (EEPROM) became available some years ago, systems ROMs or EPROMs were displaced by flash EPROM because of the possibilities offered to install new versions of "firmware" without the need for physical replacement or manipulation (such as by ultraviolet irradiation) of an EPROM device. Until recently, to reprogram even one location in flash EPROM, the entire flash EPROM device needed to be erased completely. This requirement left the procedure for installation of new "firmware" vulnerable to errors such as power failure errors. Any such error often left the device in a non-operational state and particularly left the device with the inability to reprogram flash EPROM. This led to the undesirable need for a physical replacement of the entire flash EPROM device.

Newer versions of flash EPROM are now structured to provide separately erasable regions. For example, the ATMEL flash EPROM device offers a 512 kilobyte flash EPROM device which is arranged into 2,048 sectors of 256 8-bit bytes each. Each sector is separately erasable and programmable. With the introduction of such newer flash EPROM devices, it is now possible to store a boot block of minimal software needed to make a device operational in one or more of such sectors and to agree by prearrangement that the contents of those sectors would never be erased and reprogrammed. Such prearrangement would ensure that no matter where an error in a flash update occurred, the device would always be operational.

At the same time, however, such a prearrangement leads to the disadvantage that the boot block could never be changed. This is a particular disadvantage in an embedded system, meaning systems that do not have a direct operator interface and which are embedded in other devices, such as a printer. In an embedded system, the installation of new "firmware" is typically controlled by software executing on a workstation located remotely with respect to the embedded system. For example, the embedded system may be installed in a printer connected to a LAN (Local area network), and programmed by an administrator's workstation. Typically, the new version of the "firmware" is transmitted from the workstation to the embedded system via a remote communication such as a network. At a minimum, the program steps necessary to effect the installation of the new version includes self-test, initialization, an interface driver such as a network interface driver, a protocol stack to send and to receive network packets, and a program to erase existing "firmware" and to receive and install the new "firmware". The quantity of programming required, especially if several different network protocols might be employed by the embedded system, is simply much too large to fit in a single boot block. Moreover, the program itself is complex enough so that it, itself, might need to be updated.

Accordingly, and particularly in embedded systems, there exists a need to be able to flash any executable in EPROM, including the boot block itself, in such a way as to ensure that errors during the flash process, such as errors caused by power failure or by contaminated data, can be recovered from.

SUMMARY OF THE INVENTION

This need is met by the present invention in which any executable stored in an EPROM that is arranged into separately erasable sectors can be flashed so long as flashing proceeds in a stepwise procedure. According to the stepwise procedure, old executables are not erased until after correct installation of newly-flashed executables is confirmed.

It can easily be arranged that old executables are not erased until after correct installation of new executables is confirmed, simply by providing an EPROM of twice the needed memory size. In this instance, an entire new version of executables is downloaded to the unused half of EPROM, and after confirmation that the newly-flashed version was correctly installed, the newly-flashed software is used instead of the old software, which may be erased if desired. Such a solution is ordinarily impractical and expensive, however, since it doubles EPROM memory needs, and since it ordinarily requires special hardware and software arrangements to ensure that the entire EPROM is addressable (there may be a limit to the physical address size of the central processing unit), as well as to select which half of EPROM is to be used.

Accordingly, in the present invention, flashing proceeds stepwisely, in which a boot block is flashed first, executables that are critical are flashed next, and executables that are non-critical are flashed last. Critical executables are those executables which are needed to ensure that the embedded device is operational, at least insofar as being able to communicate with a remote workstation and to re-flash EPROM if needed. Non-critical executables are those executables which are not needed to ensure operability for the purpose of re-initiating the flash procedure, and generally refer to executables specific to the functionality of the embedded systems, such as a print server or the like. In addition, the EPROM is divided into three regions: a boot block region, a file region, and a directory region. The boot block region stores at least two independently erasable boot blocks, only one of which is designated as a current boot block. The file region stores all executables, both critical and non-critical. The directory region stores multiple directories, preferably at least four, only one of which is the current directory and which designates which is the current boot block as well as the names and locations of the files stored in the file region, and which of the files are critical and which are non-critical.

Flashing of EPROM proceeds, as mentioned above, in three steps. In the first step, the unused region of the boot block region is updated with a new boot block. After confirming that the new boot block is correctly installed, a new directory is written to a free area of the directory region; the new directory contains only critical files and does not contain non-critical files. In the second step, critical files are flashed over areas formerly occupied by non-critical files, and after correct installation of the newly-flashed critical files is confirmed, a new directory is written referring only to the newly-flashed critical files. In the third step, non-critical files are flashed, and after confirming correct installation of the newly-flashed non-critical files, a new directory is written referring to the newly-flashed critical files as well as to the newly-flashed non-critical files.

By virtue of this stepwise approach, it is possible to ensure fail safe flash of EPROM without providing an EPROM of unduly large size. Specifically, because the boot block boots up the embedded device based on the current directory, and because the directory is not rewritten until after correct installation of each of the boot block, critical files and non-critical files, is confirmed, even if an error occurs during any phase of the flash process the embedded device will be able to boot up with a previously operational version.

In the present invention, the embedded firmware is structured into a set of independently constructed modules which can be contained in EPROM in compressed format and are loaded from EPROM into DRAM before execution is started. This differs from traditional embedded firmware structure, namely a monolithic single executable unit which executes directly from EPROM. If a single program step is modified in a monolithic executable unit, the entire module changes and must be replaced as a unit. This can only be accomplished if the EPROM storage capacity is twice as great a would be required to contain a single copy of the firmware.

In the present invention, by deleting the non-critical modules, sufficient space is recovered in the EPROM to contain a new set of critical modules without deleting the old set, ensuring the capability to restart the update procedure if interrupted. Since the size of the critical set is typically less than half the size of the complete set, the total EPROM capacity required is only that required to contain a single copy of the firmware.

In traditional firmware, program steps are fetched directly from EPROM. This requires that the format in EPROM be suitable for direct execution. Furthermore, execution directly from EPROM typically imposes a performance penalty since EPROM access is usually slower than DRAM access.

In the present invention, by holding the executable modules (except the boot blocks) in compressed format, expanding them to executable format only when loading them into DRAM, additional savings in required EPROM capacity can be realized and program execution speed can be increased.

This brief summary has been provided so that the nature of the invention may be understood quickly. A more complete understanding of the invention can be obtained by reference to the following detailed description of the preferred embodiment thereof in connection with the attached drawings.

BRIEF DESCRIPTION OF THE DRAWINGS

The present invention will be explained with respect to a representative embodiment thereof in which flash EPROM is installed within an embedded system. The embedded system is a network adaptor device such as that described in U.S. application Ser. No. 07/978,369, "Method And Apparatus For Interfacing A Peripheral To A Local Area Network"; and U.S. application Ser. No. 08/497,108, "Configurable Connector". The network adaptor device interface is installed into a printer and interfaces the printer to a local area network so as to allow multiple users to send print data from their respective workstations to the installed printer, and in which the EPROM is flashed from an administrator's workstation also located on the network. It should be recognized, however, that although the invention finds great utility in systems that are embedded, it can be used even in non-embedded systems.

FIG. 6 shows how FIGS. 6A & 6B are related.

FIGS. 6A and 6B together show a flow diagram for explaining operation of flashing EPROM on the embedded system.

DETAILED DESCRIPTION OF THE INVENTION

In its most preferred form, the invention is embodied in an interface board which interfaces between a local area network and a peripheral such as a printer, a scanner, a facsimile machine, a copier, an imaging processing apparatus, and so on. Also connected to the local area network are plural workstations from which peripheral data such as print data is received, as well as one particular workstation which may be an administrator's workstation from which flash EPROM on the interface board is updated with new software. Suitable interface boards are described in the aforementioned U.S. application Ser. Nos. 07/978,369 and 08/497,108, and a general description of suitable interface boards is provided herein.

[Network Architecture]

Figure 1:
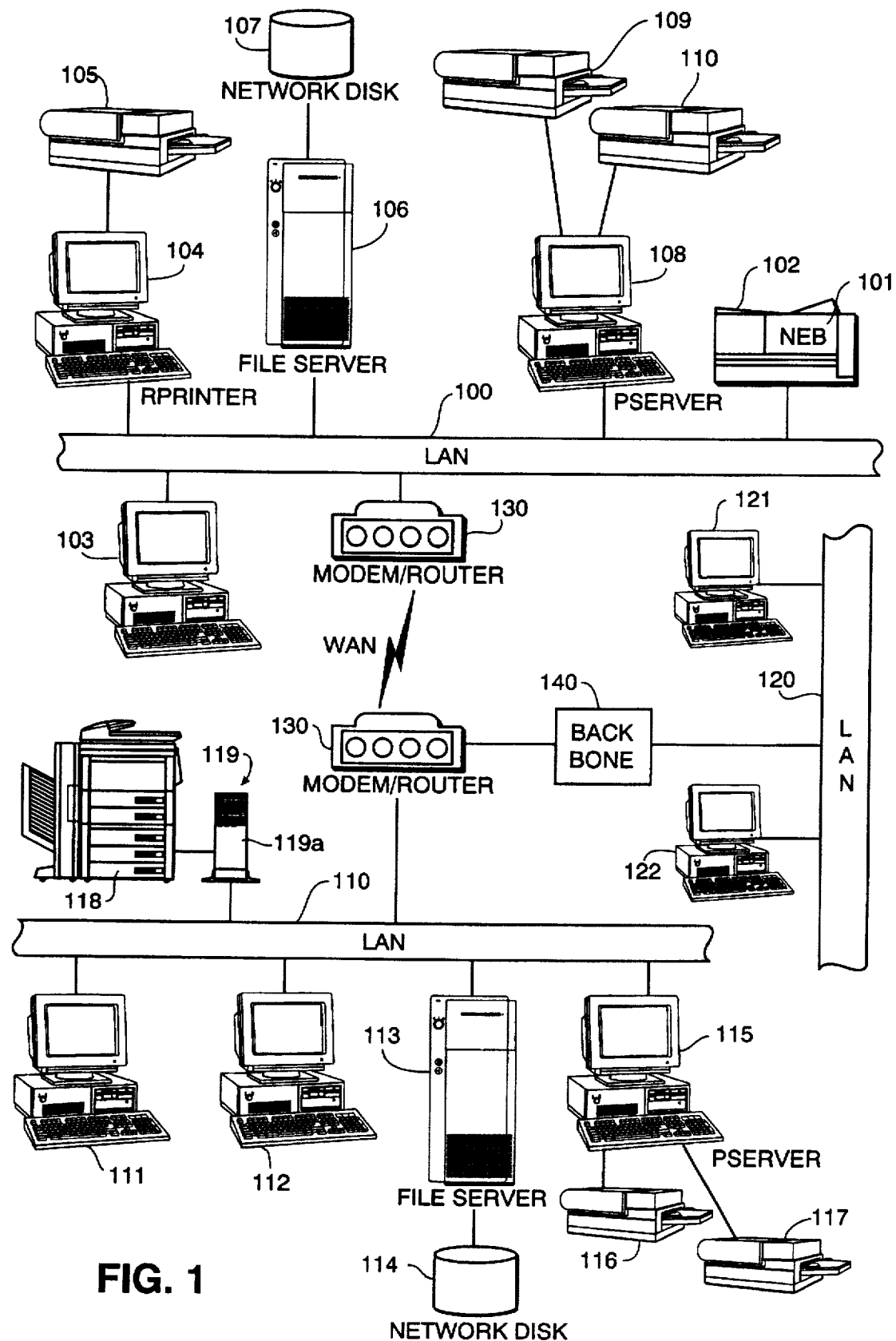
FIG. 1 is a view showing a local area network and a wide area network.

FIG. 1 is a diagram showing an interface board 101 which interfaces between a printer 102 and a local area network (LAN) 100 through a suitable LAN interface, for example, an Ethernet interface 10 Base-2 with coax connector or a 10 Base-T with RJ45 connector.

Plural workstations, such as workstations 103 and 104, are also connected to LAN 100, and under control of a suitable network operating system such as a Novell network operating system, those workstations are able to communicate with interface board 101. One of the workstations, such as workstation 103, may be designated for use as a network administrator. One or more workstations may also have a printer connected to it, such as printer 105 connected to workstation 104.

Also connected to LAN 100 is file server 106 which manages access to files stored on a large capacity (e.g., 10 gigabyte) network disk 107. A print server 108 provides print services to printers 109 and 110 connected to it, as well as to remote printers such as printer 105. Other unshown peripherals may also be connected to LAN 100.

In more detail, the network depicted in FIG. 1 may utilize any network operating system software such as Novell or UNIX software in order to effect communication among the various network members. The present embodiments will be described with respect to a LAN utilizing Novell NetWare® software, although any network software could be used. A detailed description of this network software may be found in "NetWare® User's Guide" and "NetWare® Supervisor's Guide", published by M&T Books, copyrighted 1990, incorporated herein by reference. See also the "NetWare® Printer Server" by Novell, March 1991 edition, Novell Part No. 100-000892-001.

Briefly, file server 106 acts as a file manager, which receives, stores, queues, caches, and transmits files of data between LAN members. For example, data files created respectively at workstations 103 and 104 may be routed to file server 106 which may order those data files and then transfer the ordered data files to printer 109 upon command from print server 108.

Workstations 103 and 104 may each comprise a standard IBM-PC or PC-compatible computer, capable of generating data files, transmitting such data files onto LAN 100, receiving files from LAN 100, and displaying and/or processing such files. Other computer equipment may also be incorporated into LAN 100, as appropriate to the network software being executed. For example, UNIX workstations may be included in the network when UNIX software is used, Apple MacIntosh computers may be included in the network when AppleTalk software is used, and all of those workstations may intercommunicate and communicate with interface board 101 under suitable circumstances which are described below.

Typically, a LAN such as LAN 100 services a fairly localized group of users such as a group of users on one floor or contiguous floors in a building. As users become more remote from one another, for example, in different buildings or different states, a wide area network (WAN) may be created which is essentially a collection of several LANs all connected by high speed digital lines, such as high speed integrated services digital network (ISDN) telephone lines. Thus, as shown in FIG. 1, LANs 100, 110 and 120 are connected to form a WAN via modulator/demodulator (MODEM)/transponder 130 and backbone 140, which is simply an electrical connection between several buses. Each LAN includes its own workstations, and each ordinarily includes its own file server and print server, although that is not necessarily the case.

Thus, as shown in FIG. 1, LAN 110 includes workstations 111 and 112, file server 113, network disk 114, print server 115 and printers 116 and 117. Also connected to LAN 110 is digital copier/printer 118, which may be a Canon GP-55 printer/copier. Printer/copier 118 is connected to LAN 110 via multi-device controller 119 which includes an unshown interface board 119a for interfacing between the multi device controller (and hence, digital printer/copier 118) and LAN 110. Interface board 119a is another example of an interface board in which the present invention finds particularly utility.

LAN 120 includes only workstations 121 and 122, and is not provided with its own file server or printers. Thus, workstations 121 and 122 must ordinarily utilize the printer services found remotely on LAN 100 or LAN 110, and such is readily provided for via the aforementioned interconnection of LANs 100, 110 and 120 into a wide area network. In general, via the wise area network connections, equipment in any of LANs 100, 110 and 120 can access the capability of equipment in any other of the LANs.

Workstation 104 may be embedded with an RPRINTER software program, and as such may exert limited control over network peripherals. The RPRINTER program is an MS-DOS terminate-and-stay-resident ("TSR") program that allows users to share printer 105 connected to workstation 104 while at the same time allowing workstation 104 to execute other non print applications. RPRINTER is a relatively unintelligent program that does not have the ability to search printer queues for work. RPRINTER gets its work from print servers, such as the PSERVER program running on dedicated PC 108, as well as other print servers running elsewhere in the network.

PSERVER running on dedicated PC 108 is capable of exercising more significant control over LAN peripherals but requires a dedicated PC, here PC 108 which cannot be used for any other task. PSERVER has the ability to service multiple user-defined print queues, perform dynamic search queue modification, and provide defined notification procedures for exception (failure) conditions and status and control procedures, an can control both local printers 109 and 110 (that is, printers physically connected to PC 108) and as well as remote printers via the aforementioned RPRINTER. Local printers 109 and 110 can be connected to either serial or parallel ports, and the remote printers, such as printer 105, are printers running elsewhere in the system which PSERVER controls through RPRINTER software.

[Network Workstations]

Figure 2:
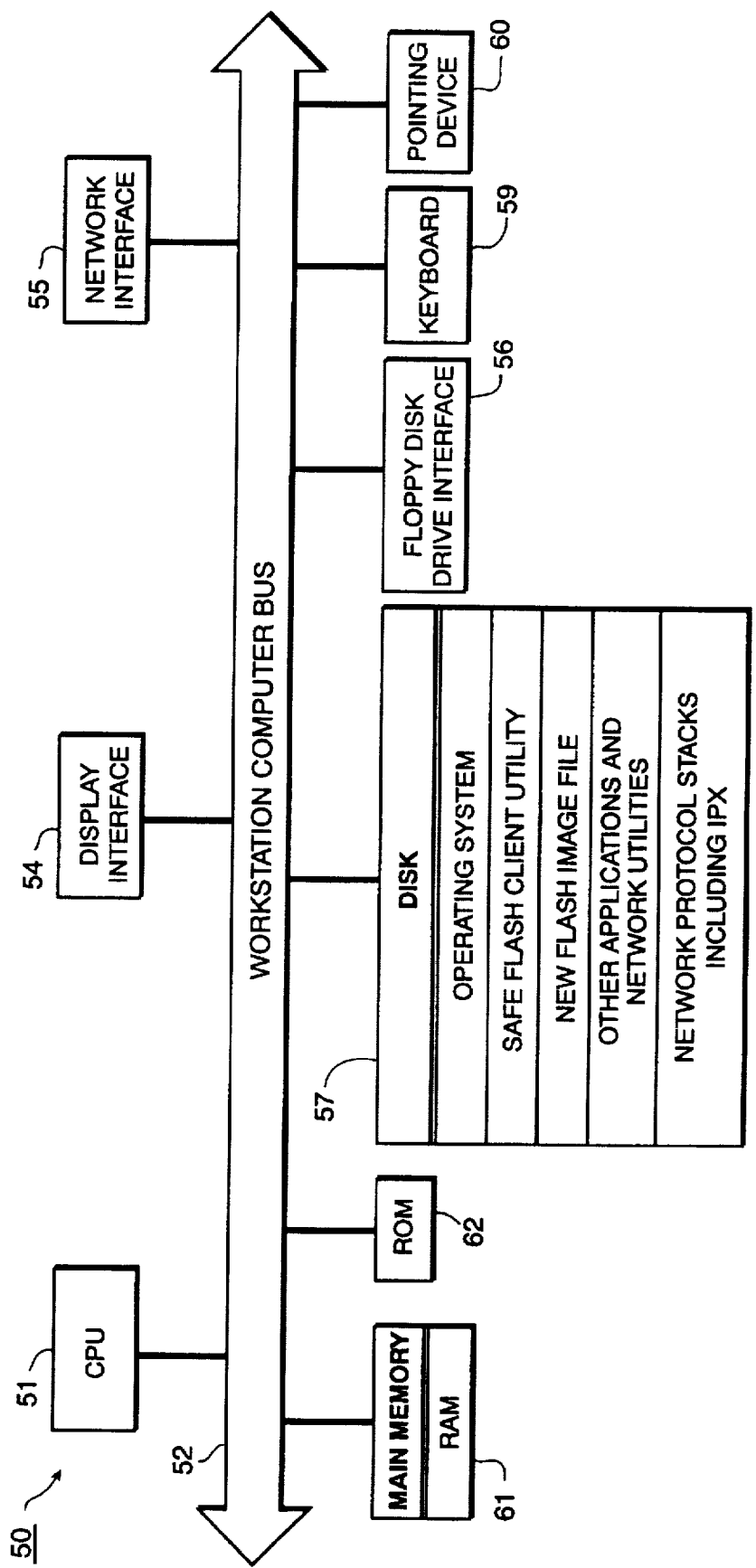
FIG. 2 is a block diagram showing construction of an administrator's workstation on the local area network.

FIG. 2 is a block diagram showing a generalized structure of a workstation connected to the LAN, such as workstation 103, 104, 11, 112, 121 or 122. An administrator's workstation may also be configured as shown in FIG. 2, and any one of the aforementioned workstations can be mentioned as the administrator's workstation. These workstations form the platforms from which print data is sent to the network interface card and, with respect to the administrator's workstation, forms the platform from which the EPROM on the network interface card is flashed with the new software.

FIG. 2 shows construction of a generalized workstation, designated as workstation 50, which, as mentioned above, may be any workstation including an administrator's on the LAN or WAN. Shown in FIG. 2 is a central processing unit 51 such as an Intel 80486 or Pentium processor, interfaced to a workstation computer bus 52. Also interfaced to workstation computer bus 52 is a display interface 54, a network interface 55 for interfacing to the local area network, a floppy disk drive interface 56 by which software is installed to hard disk drive 57, a keyboard 59, and a pointing device 60 such as a mouse or the like.

Main memory 61 which has random access memory (RAM) interfaces to computer bus 52 so as to provide CPU 51 with access to memory storage. In particular, when executing stored application program instruction sequences such as the dump and debug utilities stored on disk 57, CPU 51 loads those instruction sequences from disk 57 (or other storage media such as media accessed from the network via network interface 55) into main memory 61 and executes those stored program instruction sequences out of main memory. ROM 62 is provided for storing invariant instruction sequences such as a start-up instruction sequence for basic input/output operating system (BIOS) sequence for operation of keyboard 59 and the like.

As shown in FIG. 2, and as previously mentioned, fixed disk 57 stores program instruction sequences for an operating system, such as a windowing or DOS operating system, and for various unshown application programs. In addition, stored on fixed disk 57 is a safe flash client utility. The safe flash client utility, in coordination with a safe flash agent stored on the network interface card, operates to control fail-safe flash of a new flash image onto EPROM of the network interface card. While it is presently preferred for the safe flash client utility and the safe flash agent to cooperate in a client/server arrangement, other arrangements, including peer-to-peer are also possible.

[Interface Board]

Interface boards which interface between the network and a peripheral, such as interface boards 101 and 119a which interface between the network and printer 102 and printer/copier 118, respectively, reduce the need for dedicated PCs whose sole purpose is to service a peripheral. The architecture of the interface board provides an advantage in that the interface board includes support features for administration and management of large, multi-area WAN networks. In the case where the peripheral served by the interface board is a printer, these support features can include, for example, printer control and status monitoring from a remote location on the network, such as from the network administrators office, automatic management of printer configuration after each print job so as to provide a guaranteed initial environment for the next user, and printer logs or use of statistics accessible across the network and which characterize printer workloads and schedules for toner cartridge replacement.

Figure 3:
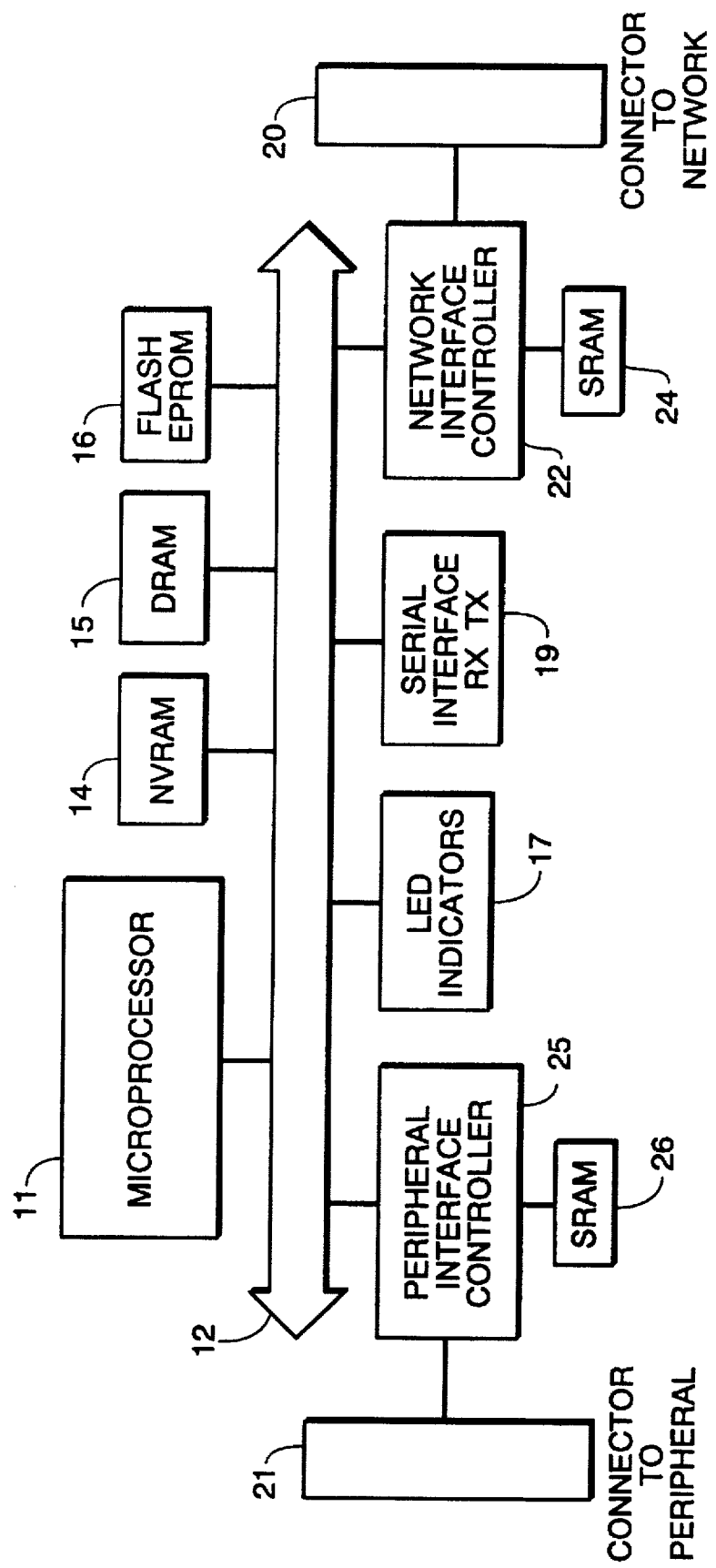
FIG. 3 is a block diagram showing an embedded system comprised by an interface board between the local area network and a peripheral device such as a printer.

A generalized block diagram of a suitable hardware construction for the interface board is shown in FIG. 3, in which reference numeral 10 designated generally an interface board such as interface board 101 and 119a. As shown in FIG. 2, interface board 10 includes a central processing unit (CPU) 11 such as an Intel 80C188EA-20 8-bit programmable microprocessor, which is interfaced to computer bus 12. Also interfaced to computer bus 12 is non-volatile RAM (NVRAM) 14, dynamic RAM (DRAM) 15, flash EPROM 16, where an electrically erasable programmable read only memory (EEPROM), drivers for LED indicators 17, and a serial interface 19 which includes both a transmit and a receive terminal. Configuration parameters and other important information that must be retained between power cycles are stored in NVRAM 14; however, in most configurations it may be possible to store such configuration parameters and other information in EPROM 16 and top delete NVRAM 14. Process steps for execution by microprocessor 11 are stored in EPROM 16, but in general before the process steps are executed, they are copied from EPROM 16 into DRAM 15 (or they are shadowed) for execution out of DRAM 15. LED indicators 17 are provided so as to give a user a general indication as to the processing status of interface board 10 and may, for example, include indicator LEDs for power and data communication. Serial interface 19 is provided so as to allow local serial access to interface board 10, such as described in U.S. application Ser. No. 08/336,102, "Low-Cost Serial Port".

As mentioned previously, interface board 10 interfaces between the local area network and the peripheral, and is therefore provided with a connector 20 for connecting to the LAN as well as connector 21 for connecting to the peripheral. A network interface controller 22, which is connected to bus 12 and to network connector 20, provides hardware interface for capturing and assembling data packets for receipt from and transmission onto the LAN, and also provides a hardware interrupt to microprocessor 11 so as to signal that LAN data packets have been captured and are available for use by the microprocessor. Static RAM (SRAM) 24 is provided for network interface controller 22 so as to store, on a temporary basis, such data packets.

On the peripheral side, a peripheral interface controller 25, which is connected to bus 12 and peripheral connector 21, provides peripheral interface between interface board 10 and the peripheral serviced by interface board 10. Peripheral interface controller 25 may be any of a variety of different controllers and can, for example, be constructed in a bi-directional interface (such as with a SCSI interface, an IEEE-1284 interface, a dual port RAM interface, a shared RAM interface, and the like) or a uni-directional interface (such as a standard Centronix RX232 interface or the like). Peripheral interface controller 25 is provided with SRAM 26 for temporary storage of data transmitted to and from interface board 10 and the peripheral serviced by interface board 10.

As described in the aforementioned U.S. application Ser. Nos. 07/978,369 and 08/497,108, the interface board can communicate on the local area network through any of various protocol stacks. Specially contemplated in the invention herein are protocol stacks for communication using Novell's SPX/IPX protocol stack, UNIX's TCP/IP protocol stack, Apple's AppleTalk, and IBM's NETBEUI protocol stack.

[Organization of Flash EPROM]

Figure 4:
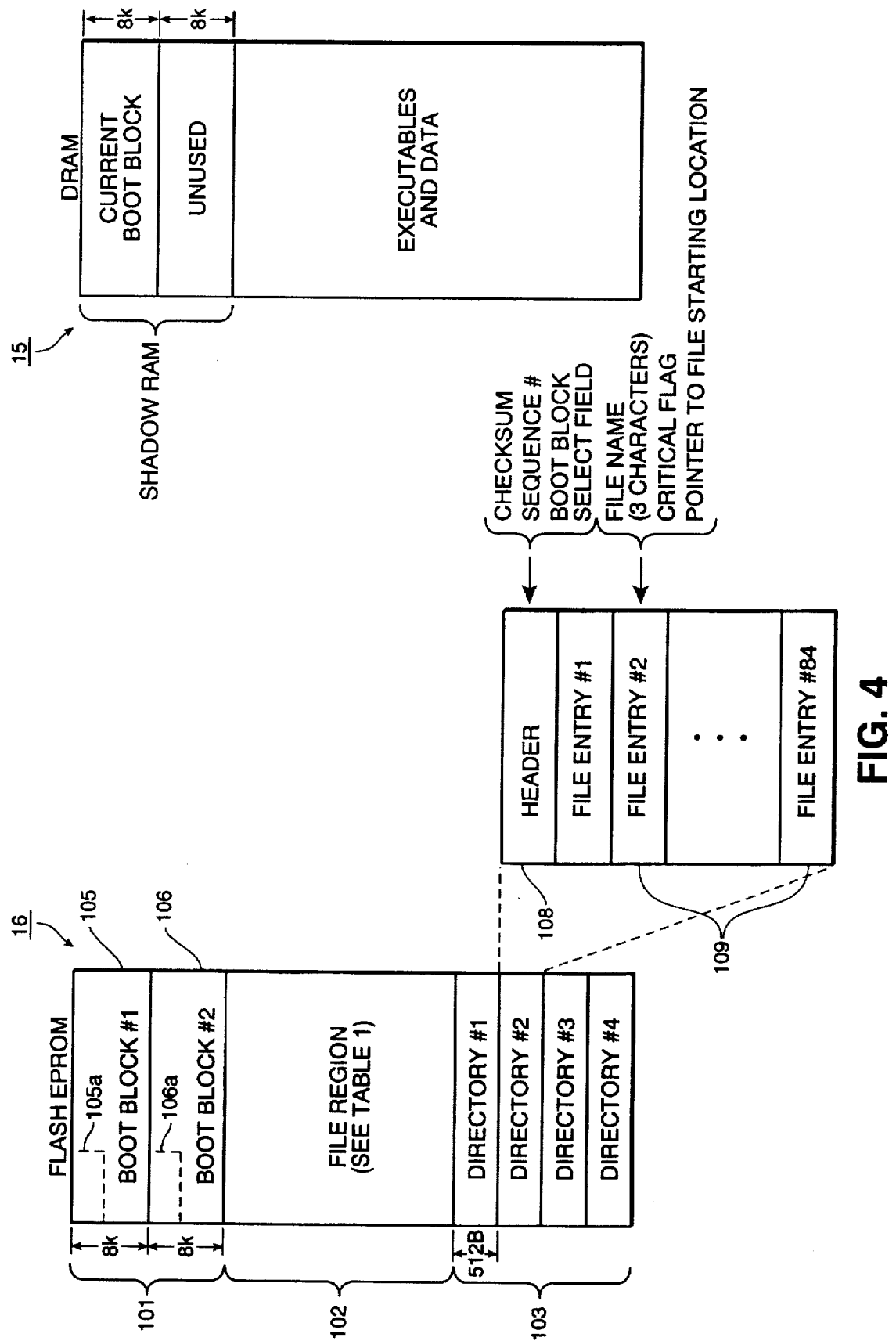
FIG. 4 is a diagram illustrating various regions in EPROM and in DRAM.

FIG. 4 is a diagram illustrating the organization of flash EPROM 16 and DRAM 15. It should be understood that while FIGS. 3 and 4 depict each of EPROM 16 and DRAM 15 as a single memory device having a monolithic storage space, it is possible to provide the various regions shown in FIG. 4 in physically separate memory devices, so as to assist in implementing the independently erasable properties of EPROM 16, or to combine the devices to achieve the needed properties.

Specifically referring to FIG. 4, flash EPROM 16 is an electrically erasable programmable read only memory, typically called a flash EPROM, such as the aforementioned ATMEL flash memory. The flash EPROM is comprised by individually erasable and programmable sectors, each preferably small with respect to the overall size of the EPROM memory area. For example, the ATMEL device is a 512 kilobyte device arranged into 2,048 different sectors of 256 bytes each, with each sector being independently erasable and programmable with respect to the other sectors.

As shown in FIG. 4, EPROM 16 is divided into three regions: a boot block region 101, a file region 102, and a directory region 103. The boot block region stores at least two different versions of a fully operational boot block; two, designated at 105 and 106 are used in the present embodiment. Each boot block is 8K Bytes long, making boot block region 101 16K Bytes in total. In addition, each boot block region 105 and 106 includes at least one segment, designated respectively at 105a and 106a, which corresponds to two independently erasable and reprogrammable sectors of the EPROM, here 512 bytes. Microprocessor 11 is hardwired so that it always begins execution at a predesignated address corresponding to the beginning of region 105a; region 106a is accordingly never used. In addition, region 105a is never erased or reprogrammed during a safe flash operation. Region 105a contains the following steps, which are considered never to need change or update and which, consequently, are not considered by the inventors to present any significant constraints in the overall reprogrammability of EPROM 16:

(1) Scan all areas of the directory region to determine which copy of the directory is the current directory (i.e., having the highest sequence number as described below).

(2) Examine the boot block select field of the current directory to determine which of the two copies of the boot block, namely boot blocks 105 or 106, is the current boot block.

(3) Copy the selected boot block from flash EPROM to the topmost region of DRAM 15, and switch the memory access path for microprocessor 11 from flash EPROM 16 to DRAM 15 (i.e., enable shadow RAM).

(4) Execute the remainder of the boot block program steps out of the shadow DRAM.

It is the remainder of boot block regions 105 and 106 which contain self-test, initialization, and program loading, all of which are considered to be susceptible of updating and the like.

Directory region 103 is arranged to store at least two directories; four are shown in the preferred embodiment. Each directory is 512 bytes long, and each contains an eight byte header 108 followed by 84 six-byte file entries 109. As shown in FIG. 4, each header includes a checksum, a sequence number, and a boot block select field. The checksum is used to verify that the information in the directory is valid, and the sequence number indicates which directory is the most currently written. By finding a directory whose sequence number is the highest and whose checksum is valid, it is possible for boot block region 105a to determine which of the directories in directory region 103 is the current directory.

Header 108 also includes a boot block select field which, as mentioned above, determines which of the boot blocks in boot block region 101 should be shadowed to DRAM 15.

Each file entry 109 includes a three character file name, a "critical flag", and a pointer to the file's starting location within file region 102. In more detail, the three character file name is referred to by other routines when determining which files should be loaded from EPROM 16 to DRAM 15. In particular, and in the most preferred form of the invention, the three character identifiers are referred to when forming the configuration mask described in co-pending U.S. application Ser. No. 07/978,286, "In An Interactive Network Board, Method And Apparatus For Forming An Operational Configuration Of The Board". Accordingly, so long as a file stored in file region 102 is identified by a file entry, then it is possible to copy the file to DRAM 15 for execution. Since there are 84 file entries 109, up to 84 different executable files stored in file region 102 can be identified.

The critical flag is a one-byte flag which indicates whether the executable file is a file critical for operability of the network interface card, or whether the file is non-critical in the sense that the file is not required for resumption of an interrupted, or unsuccessful, safe flash operation. Critical flags are discussed below in connection with Table II.

The pointer to the file starting location is a pointer to the fist location of the executable file in file region 102. It should be noted that the file might not exist as contiguous locations within file region 102, but rather might exist as a linked list to widely dispersed regions within file region 102. In addition, it is possible for the executable files in file region 102 to be compressed, in which case they are decompressed as they are loaded into DRAM 15.

File region 102 stores executable files which may (or may not, in accordance with the configuration stored by application Ser. No. 07/978,286) be copied into DRAM 15. Specifically, while it is conventional to arrange the program for an embedded device such as the disclosed network interface card into one large homogeneous executable file, the present invention is particularly well adapted for a multiplicity of separately executable files, the execution of which is coordinated by an operating system such as a non-preemptive monitor program. As currently contemplated, file region 102 stores the executable files shown in the following Table I, which gives file names, three character file identifiers used in file entry filed 109, and a brief description of file functionality.

TABLE I

Executable Files

| Three Character Identifier | Brief Description of Function |
| --- | --- |
| INI | Default Module Load List |
| PRG | File System Write Module |
| AGN | Sector Flash Agent |
| SFA | Safe Flash Agent |
| ZIP | Decompress Module |
| MON | Monitor |
| XPL | Printer Physical Interface Module |
| RPC | SNMP Instrumentation Module |
| MLI | Network Physical Layer Driver |
| LSL | Link Service Layer Module |
| IPX | IPX/SPX Protocol Stack Module |
| NET | Network Request Layer Module |
| CPS | Client Program Support Module |
| SAP | Service Advertising Protocol Module |
| CFG | Low Level Configurator Module |
| PSE | PRINT Server Application Module |
| RPR | Remote Printer Application Module |
| APL | AppleTalk Protocol Stack |
| APS | AppleTalk Print Application |
| IPT | TCP/IP Protocol Stack |
| IN1 | TCP/IP Thread |
| TIC | TCP/IP Thread |
| TIM | TCP/IP Thread |
| LPS | TCP/IP Printer Application |
| LPD | TCP/IP Printer Application |
| PII | Protocol Stack Independent Interface |
| SNM | SNMP Agent |
| TPG | Text Page Print Module |
| NVo | Non-Volatile RAM File |
| NV1 | Non-volatile RAM File |
| NV2 | Non-Volatile RAM File |
| FVC | Flash Validation File |

Associated data files can also be stored in file region 102. Both data and executable files are ordinarily stored in modules that are not suitable for direct execution. Each module is stored in 512 byte clusters, the first two bytes of which hold a value that is used to locate the next cluster of the file. If the first two bytes are zero, then the cluster is the last cluster of the file. The remaining 510 bytes of each cluster hold contents of the file, optionally in a compressed format. In this manner, a file need not occupy a contiguous region of flash EPROM, and the first cluster of each file is pointed to by the file entry 109 for the file in question.

As mentioned above, each file (or at least those files for which a file entry 109 is present in the current directory) has a "critical flag" indicating whether the file is critical or non-critical to basic operability of the network interface card. At a minimum, the critical flag will indicate simply whether or not the file is critical. In the present embodiment, it is preferred that the critical flag indicate whether the file is always critical, never critical, or whether the file is only critical with respect to a particular protocol stack such as IPX/SPX, TCP/IP, AppleTalk or NETBEUI.

The following Table II gives critical flags for each of the files listed in the above Table I. As seen in Table II the critical flag is a one byte flag in which FF indicates that the file is always critical, 00 indicates that the file is never critical, 01 indicates that the file is critical to IPX/SPX, 02 indicates that the file is critical to TCP/TP, 04 indicates that the file is critical to AppleTalk, and 08 indicates that the file is critical to NETBEUI. As thus formulated, it can be seen that the critical flags are binary digits and a file can therefore be critical to more than one protocol.

TABLE II

Critical Flags

| Three Character Identifier | Critical Flags (in Hexadecimal) |
|---|---|
| INI | FFh |
| PRG | FFh |
| AGN | 00h |
| SFA | FFh |
| ZIP | FFh |
| MON | FFh |
| XPL | FFh |
| RPC | FFh |
| MLI | FFh |
| LSL | FFh |
| IPX | 01h |
| NET | 01h |
| CPS | FFh |
| SAP | 01h |
| CFG | FFh |
| PSE | 00h |
| RPR | 00h |
| APL | 04h |
| APS | 00h |
| IPT | 02h |
| IN1 | 02h |
| TIC | 02h |
| TIM | 02h |
| LPS | 00h |
| LPD | 00h |
| PII | FFh |
| SNM | 00h |
| TPG | FFh |
| NVO | FFh |
| NV1 | 00h |
| NV2 | 00h |
| FVC | 00h |

[Boot-up Operation Of The Network Interface Card]

Figure 5:
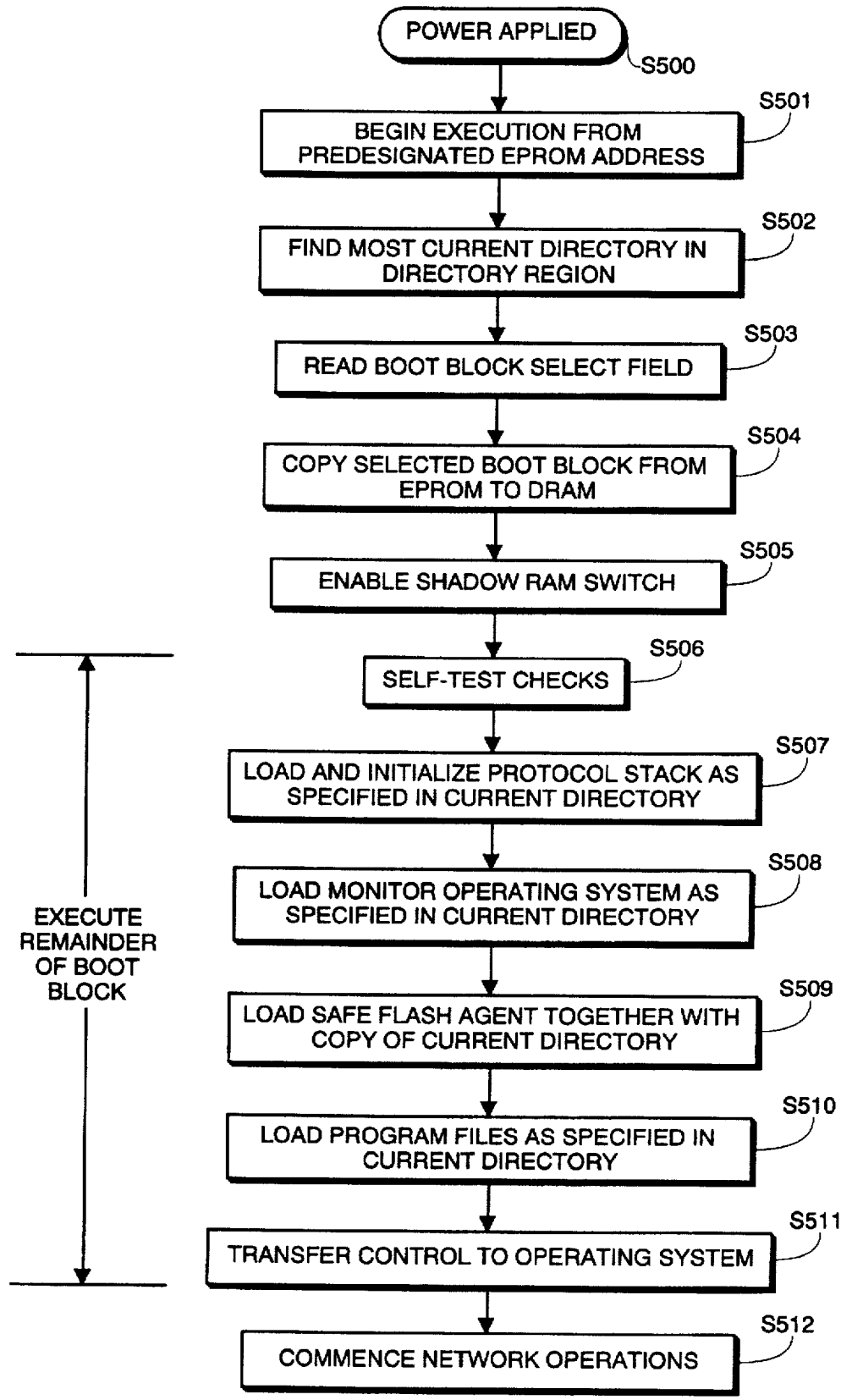
FIG. 5 is a flow diagram for explaining boot up operations of the embedded system.

FIG. 5 is a flow diagram showing operation of the network interface card upon application of power (i.e., boot-up operation). In general, the process steps shown in FIG. 5 operate so that after application of power, execution begins from a predesignated EPROM address (the beginning of region 105a) to find the current directory in directory region 103, to read the boot block select field from the current directory region, to copy the selected boot block from EPROM to DRAM, and to enable a shadow RAM switch so as to execute the remainder of the selected boot block out of DRAM. Execution of the remainder of the boot block causes selected files including an operating system to be loaded from EPROM 16 to DRAM 15, whereafter control is passed to the operating system and network operations are commenced.

Thus, after application of power in step S500, microprocessor 11 begins execution from the predesignated address in EPROM 16, i.e., the beginning of region 105a (step S501). As mentioned above, region 105a is programmed so as to select the current directory in directory region 103 (step S502). This can be done by scanning each of the different directories in directory region 103 so as to find a directory with the highest sequence number together with a valid checksum.

After determining which is the current directory, flow advances to step S503 in which the boot block select field from the current directory is read. The boot block select field determines which of boot blocks 105 and 106 controls the remainder of boot up operations, and in accordance with program steps stored in region 105a the selected boot block is copied from EPROM 16 to DRAM 15 (step S504). Thereafter, a shadow RAM switch is enabled (step S505), causing microprocessor 11 to continue execution of the selected boot block, but out of DRAM 15 instead of out of EPROM 16.

In steps S506 through S511, the remainder of the boot block is executed whereby initialization and self-test is performed, and whereby selected files which support the current configuration are loaded from file region 102 into DRAM 15. Thus, step S506 performs initialization and self-test checks, step S507 loads and initializes network protocol stacks (of which at least some are ordinarily designated as critical files) as specified in the current directory, step S508 loads the monitor operating system (which ordinarily is designated as a critical file) as specified in the current directory, step S509 loads a safe flash agent (also designated as a critical flag) together with a copy of the current directory into DRAM 16, step S510 loads program files (of which most are ordinarily designated as non-critical) as specified in the current configuration, and step S511 transfers control to the operating system.

Thereafter, in step S512, normal network operations are commenced.

[Operational Of Safe Flash Client]

Figure 6B:
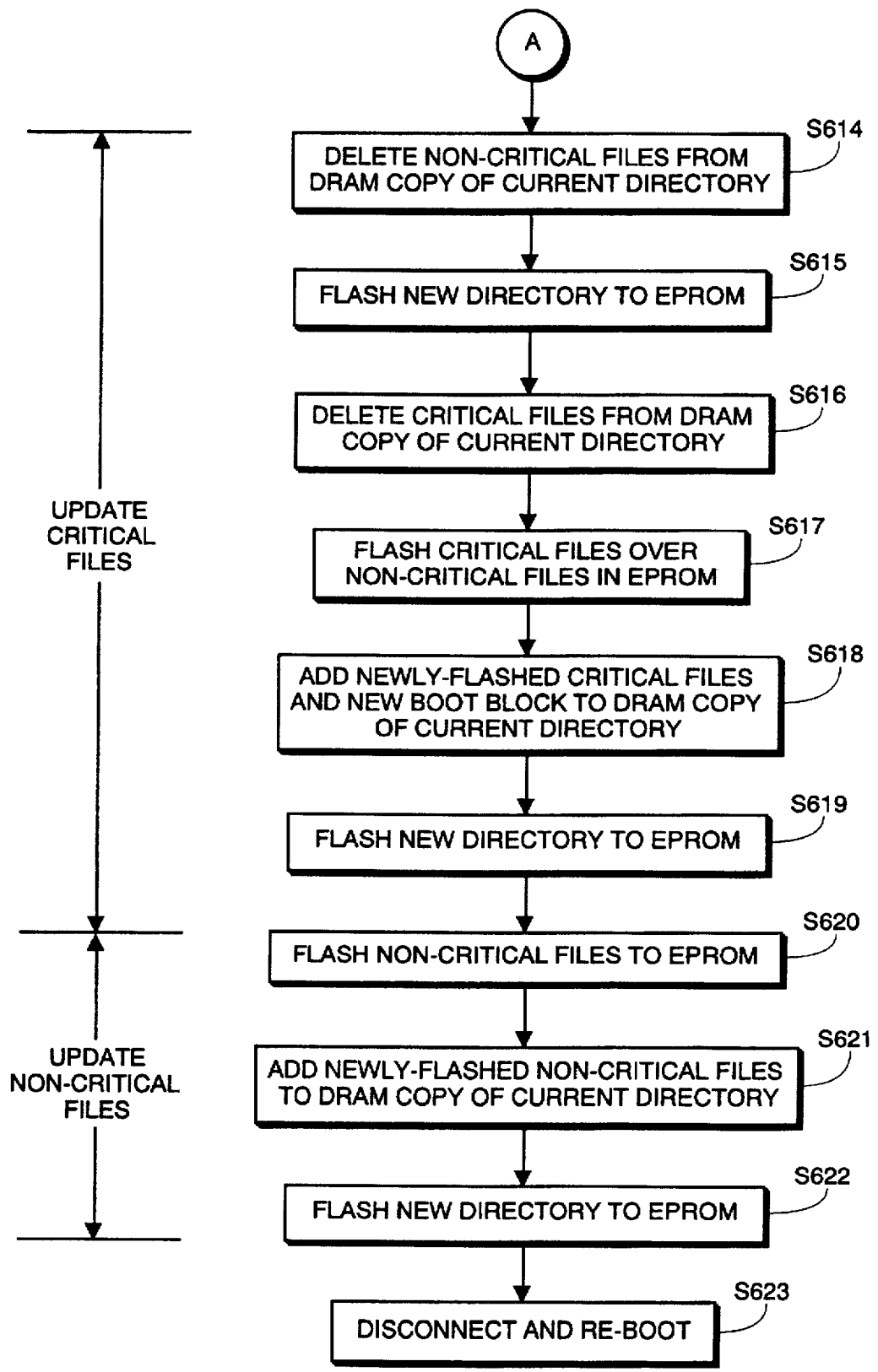

FIG. 6 is a flow diagram illustrating operation of the safe flash client shown in disk 57 of network administrator's workstation 50. In general, the process steps shown in FIG. 6 operate to identify a device whose EPROM is to be flashed, to connect to the safe flash agent on that device, to update the boot block on the device (if needed), to udpate critical files on the device, and to thereafter update non-critical files. After each update (i.e., of the boot block, the critical files and the non-critical files), a new directory is also flashed. Because of the sequence by which files are updated (by which new files are programmed into non-essential areas of EPROM), and because a new directory is flashed only after correct installation is confirmed for each such update, any errors encountered during the flashing process can easily be recovered from since the device can always be re-booted from an already existing operational state.

As previously mentioned, the safe flash client program whose operation is depicted in FIG. 6 communicates over the network with a safe flash agent program executed in the embedded device. Communication is achieved by the exchange of network packets. The safe flash client sends a request packet to the safe flash agent and awaits a reply packet. Each packet sent by the safe flash client contains a coded value which specifies a requested action. The reply packet from the safe flash agent will confirm whether the request has been successfully acted upon. The following Table III gives a list of suitable request code values, together with a brief description of the requested action:

TABLE III

Request Codes

| REQUESTED ACTION | BRIEF DESCRIPTION OF REQUESTED ACTION |
|---|---|
| IDENTIFY | Returns connect state, product ID, etc. |
| CONNECT | Gains exclusive access, returns free space, etc. |
| DISCONNECT | Releases exclusive access |
| DISCONNECT_AND_REBOOT | Releases exclusive access and re-boots the embedded system |
| START_FLASH | Terminates print applications and disables client access |
| READ_DIRECTORY | Returns the DRAM copy of the current directory |
| WRITE_DIRECTORY | Writes the DRAM copy of the directory to EPROM |
| DELETE_NON CRITICAL_FILES | Deletes non-critical files from the DRAM directory |

TABLE III-continued

Request Codes

| REQUESTED ACTION | BRIEF DESCRIPTION OF REQUESTED ACTION |
| --- | --- |
| DELETE_CRITICAL_FILES | Deletes critical files from the DRAM directory |
| DELETE FILE | Deletes the specified file from the DRAM directory |
| ADD_FILE | Adds a file name and file link to the DRAM directory |
| WRITE_LAST_FILE_CLUSTER | Allocates a free cluster in the file area and writes the last cluster of a file to the EPROM |
| WRITE_PREV_FILE_CLUSTER | Allocates a free cluster in the file area and writes a previous cluster of a file (linked to its successor) to EPROM |
| WRITE_FIRST_FILE_CLUSTER | Allocates a free cluster in the file area and writes the first cluster file (linked to its successor) to EPROM |
| ADD_BOOT BLOCK | switches the boot block select field to the alternate block |
| WRITE_SINGLE_FILE_CLUSTER | Allocates a free cluster in the file area and writes a single cluster file to EPROM |
| WRITE FIRST_BOOT_CLUSTER | Sets the cluster write pointer to the first cluster of the inactive boot block and writes the first cluster of the boot block to EPROM |
| WRITE_FIRST_DIR_CLUSTER | Sets the cluster write pointer to the first cluster of the directory area and writes ten first directory cluster to EPROM ("unsafe flash") |
| WRITE_NEXT_CLUSTER | Write subsequent clusters, incrementing the cluster write pointer, (of boot block or of full EPROM image) |

Reverting to FIG. 6, step S610 initiates an inquiry to find candidates for flashing. A list of all devices responding to such an inquiry is collected by the workstation, whereafter in step S602 an IDENTIFY packet is sent to each candidate device so as to identify which candidate should be flashed. Once the flash device has been identified, step S603 locates and analyzes a new flash EPROM image file. Step S604 sends a CONNECT packet to connect to the device that was identified in step S602 and gain exclusive access to the device. Step S605 analyzes free space available in the device's EPROM, and if there is insufficient space available for the new EPROM image (step S606), then in step S607 the workstation disconnects from the device and the flash process is exited (step S608) as unsuccessful.

On the other hand, if there is sufficient space available in the device's EPROM, flow advances to step S609 in which a START_FLASH packet is sent repeatedly so as to activate a safe flash agent on the device. The safe flash agent on the device, once activated, operates to terminate all on-going peripheral activities such as print applications and also operates to disable client access by any other workstation except the administrator's workstation. Thus, a successful reply packet from the device indicates that all peripheral operations have been shut down and/or terminated, and that the device is ready to be flashed.

Steps S610 and S611 operate to flash a new boot block into the device, if such is needed. Specifically, in step S610, a new boot block is flashed into the unused boot block region of EPROM 16. Thus, for example, if the boot block select field of the current directory indicates that the boot block 106 is the current boot block, then step S610 flashed into boot block region 105. Flashing is accomplished by sending a WRITE_FIRST_BOOT_CLUSTER to transmit the first cluster of the boot block. Thereafter, 15 WRITE_NEXT_CLUSTER packets are transmitted so as to transmit the remaining clusters of the boot block. Step S611 confirms that the new boot block has been correctly installed, for example, by inspecting the reply packets for any of the 16 WRITE commands to determine if any of the commands have failed. If the new boot block has not been correctly installed, then flow branches to step S612 in which the device is disconnected and the safe flash client is exited (step S613), inasmuch as the device is not flashable.

As will be appreciated, since the new boot block is flashed to the unused region of boot block region 101, the old boot block region is still completely operational. Thus, should any failures occur up to this point during the flashing process, inasmuch as no changes have been made to the current directory, region 105a (which, as mentioned above, is never altered) will still cause the old boot block region to be selected for boot-up operations of the network device. It therefore will be appreciated that flashing is, at least to this point, fail-safe.

In steps S614 through S619, critical files are updated. Thus, in step S614, non-critical files are deleted from the DRAM copy of the current directory (the copy stored with the safe flash agent in DRAM 15). Deletion is accomplished by sending a DELETE_NON CRITICAL_FILES packet. Note that the EPROM copy of the current directory is not affected, and only the DRAM copy is affected. Accordingly, should any error occur during execution of step S614, the current directory in directory region 103 would be re-selected during boot-up, resulting in a flash operation that is, at least to this point, fail-safe.

Flow then advances to step S615 in which a new directory is flashed to EPROM. Flashing a new directory to EPROM is accomplished by sending a WRITE_DIRECTORY packet. Specifically, a new directory with non-critical files deleted is flashed to directory region 103. The new directory will include file entries 109 only for critical files, and header 108 will include checksum, a next highest sequence number, and with the boot block select field unchanged. It will be appreciated that until after completion of step S615, the old current directory is still valid. Accordingly, should any errors occur during execution of step S615, the old current directory will be selected upon reboot of the network device, resulting in a flash operation that is, at least to this point, fail-safe. Should an error occur after step S615 completes correctly, the new current directory will be selected upon reboot but the old boot block and the old critical files will be used as before. Although non-critical files will no longer be available for loading, the critical files needed to re-initiate the safe flash sequence will be operational.

The reason for leaving the boot block select field unchanged is as follows. Specifically, it is possible for the newly-flashed boot block (step S610) to require some interaction with new features in new critical files, which have not yet been flashed. Thus the new boot block might be inconsistent with the old critical files. If an error occurs before the new critical files have been correctly installed, then it is considered to be safer for a re-boot operation to proceed with an old boot block and old critical files, rather than with a new boot block and old critical files. After new critical files have been correctly installed, then a new directory can be written in which both the book block select field and the new critical files are updated, as described below.

In step S616, critical files are deleted from the DRAM copy of the current directory (i.e., not from the EPROM copy of the current directory). Again, should any errors occur during step S616, since only the DRAM copy has been affected, successful re-boot can be accomplished from the EPROM copy of the current directory, resulting in a flash operation that is, at least to this point, fail-safe.

Step S617 flashes critical files for each critical file in the new EPROM image. The critical files are flashed over non-critical files in EPROM 16, so that older versions of critical files are unaffected and can be used should any error occur during the flash operation. Critical files are flashed by sending a sequence of WRITE_LAST_FILE_CLUSTER and WRITE_PREV FILE_CLUSTER commands, or by sending a sequence of WRITE_FIRST_FILE CLUSTER and WRITE_SINGLE_FILE_CLUSTER commands, until a complete file has been transferred. Then in step S618, newly-flashed critical files are added to the DRAM copy of the current directory, by sending an ADD_FILE command. In addition, step S618 updates the boot block select field so as to select the boot block flashed in step S610. Specifically, the new boot block (flashed in step S610) is activated by altering the boot block select field of the DRAM copy of the directory by sending an ADD_BOOT_BLOCK command. Finally, the transition to the new critical files and the new boot block is completed.

Since the EPROM copy of the current directory is still unaffected, it will be appreciated that any errors occurring during steps S617 or S618 will not affect operability of the network interface card, since the current directory still contains an operable version of the device that can be used during re-boot. Accordingly, the flash operation is, at least to this point, fail-safe.

Finally, update of critical files is completed in step S619 by flashing the new directory in DRAM to EPROM. Flashing a new directory to EPROM is accomplished by sending a WRITE-DIRECTORY packet. Until successful completion of step S619, the current version of the EPROM directory was the version flashed in step S615. Accordingly, until after successful completion of step S619, that old version will still provide an operable software configuration which will permit the device to re-boot into an operable state. After successful completion of step S619, should any errors occur thereafter, the device will boot up in a new operational state specified by the directory of step S619.

Steps S620 through S622 update non-critical files. Thus, in step S620, non-critical files are flashed to EPROM over locations previously occupied by non-critical files, as well as over locations previously occupied by old versions (i.e., not the version flashed in step S617) of critical files. Flashing non-critical files is accomplished, for each non-critical file in the new EPROM image, by sending a sequence of WRITE_LAST_FILE_CLUSTER and WRITE_PREV_FILE CLUSTER commands, WRITE_FIRST_FILE_CLUSTER and WRITE_SINGLE_FILE_CLUSTER commands, until the complete file has been transferred. After non-critical files have been flashed, flow advances to step S621 in which the newly-flashed non-critical files are added to the DRAM copy of the current directory.

Since the EPROM version of the current directory has not yet been effected, errors occurring during steps S620 or S621 will result in a system that will re-boot in accordance with the directory flashed in step S619. Thus, it will be appreciated that the flash process is, at least to this point, fail-safe.

Flow then advances to step S622 in which a new directory is flashed to EPROM. Flashing a new directory is accomplished by sending a WRITE_DIRECTORY packet. Successful completion of step S622 completes the flash process, whereas unsuccessful completion means that the device will re-boot in accordance with the operable configuration specified by the directory flashed in step S619. In either event, it will be appreciated that the flash operation is completely fail-safe.

Accordingly, in step S623, a DISCONNECT_AND_REBOOT packet is sent to the device to disconnect the device and to reboot the device in the new operational configuration.

The invention has been described with respect to a particular illustrative embodiment. It is to be understood that the invention is not limited to the above described embodiment and that various changes and modifications may be made by those of ordinary skill in the art without departing from the spirit and scope of the invention.

What is claimed is:

1. A flashable embedded device comprising:
  a flashable EPROM arranged into separately erasable sectors, the EPROM being divided into at least three regions including a boot block region, a file region and a directory region;
  wherein said file region has stored therein plural executable files of program instruction sequences;
  wherein said directory region has stored therein at least two directories including a current directory, each of the directories having a boot block select field and file entries which identify at least some of the files stored in said file region; and
  wherein said boot block region has stored therein at least two boot blocks, one of which begins at a predesignated address, and which contains process steps which scan said directory region to identify the current directory, and to identify the boot block select field of the current directory;
  said flashable embedded device further including a DRAM into which executable program instruction sequences may be copied from said EPROM; and
  a microprocessor for executing program instruction sequences commencing at power application from the predesignated address in said EPROM;
  wherein upon power application, said microprocessor commences execution of program instruction steps at the predesignated address of said EPROM so as to scan said directory region to determine the current directory, to select one boot block from said boot block region based on the boot block select field of the current directory, to complete execution of the selected boot block whereby at least some files stored in said file region and listed in the current directory of said directory region are transferred to said DRAM, and to commence execution of said files stored in DRAM.

2. A flashable embedded device according to claim 1, wherein files in said file region include a safe flash agent which is adapted to communicate with a safe flash client located remotely of said embedded device.

3. A flashable embedded device according to claim 2, wherein files in said file region are designated as critical or non-critical, and wherein said safe flash agent is adapted to respond to commands from said safe flash client so as to flash new versions of critical files into said EPROM and to confirm correct installation thereof before flashing new versions of non-critical files into said EPROM.

4. A flashable embedded device according to claim 2, wherein said safe flash agent is adapted to write a new directory into said directory region, and to designate the newly-written directory as a current directory, after critical files have been written.

5. A flashable embedded device according to claim 4, wherein said safe flash agent is adapted to write a new directory into said directory region, and to designate the newly-written directory as a current directory, after non-critical files have been written.

6. A method for flashing flashable EPROM that is arranged into separately erasable sectors and which is divided into at least three regions including a boot block region, a file region, and a directory region, the method comprising the steps of:

a boot block flash step in which an unused region of said boot block region is updated with a new boot block;

a critical file flash step in which critical files in said file region are flashed over non-critical files, and in which a new directory is written into said directory region after successfully flashing critical files; and a non-critical file flashing step in which non-critical files are flashed into said file region, and in which a new directory is written into said directory region after successfully flashing non-critical files.

7. A method according to claim 6, wherein in said boot block flashing step, at least one sector of said EPROM is not erased.

8. A method according to claim 6, further comprising a step of storing a copy of a current directory from said directory region into DRAM for use during said critical file flashing step and said non-critical file flashing step.

9. A method according to claim 8, wherein said critical file flashing step is produced by the step of deleting, from the DRAM copy of a current directory, non-critical files, and flashing said directory region with the DRAM copy of the directory region.

10. A method according to claim 9, wherein said critical file updating step further includes the step of deleting critical files from the DRAM copy of the current directory, and adding newly-flashed critical files to the DRAM copy of the current directory.

11. A method according to claim 10, further comprising the step of flashing the DRAM copy of the directory to said directory region of the EPROM.

12. A method according to claim 8, wherein said non-critical file flashing step includes the step of adding newly-flashed non-critical files to the DRAM copy of the current directory, and flashing the DRAM copy of the directory to said directory region of the EPROM.

13. Computer executable process steps stored on a computer-readable medium, said steps for flashing flashable EPROM that is arranged into separately erasable sectors and which is divided into at least three regions including a boot block region, a file region, and a directory region, said steps comprising:

a boot block flash step in which an unused region of said boot block region is updated with a new boot block;

a critical file flash step in which critical files in said file region are flashed over non-critical files, and in which a new directory is written into said directory region after successfully flashing critical files; and a non-critical file flashing step in which non-critical files are flashed into said file region, and in which a new directory is written into said directory region after successfully flashing non-critical files.

14. An apparatus for flashing flashable EPROM that is arranged into separately erasable sectors and which is divided into at least three regions including a boot block region, a file region, and a directory region, said apparatus comprising:

a memory including a region for storing executable process steps and including a region for storing a new boot block, new critical files, and new non-critical files; and a processor for executing the process steps stored in said memory;

wherein the process steps include (i) a boot block flash step in which an unused region or said boot block region is updated with a new boot block, (ii) a critical file flash step in which critical files in said file region are flashed over non-critical files, and in which a new directory is written into said directory region after successfully flashing critical files, and (iii) a non-critical file flashing step in which non-critical files are flashed into said file region, and in which a new directory is written into said directory region after successfully flashing non-critical files.

* * * * *